(12) United States Patent
Kreuchauf et al.

(10) Patent No.: US 8,135,920 B2
(45) Date of Patent: Mar. 13, 2012

(54) APPARATUS AND METHOD FOR CONTROLLING THE ACCESS OPERATION BY A PLURALITY OF DATA PROCESSING DEVICES TO A MEMORY

(75) Inventors: Jürgen Kreuchauf, München (DE); Carsten Mielenz, Landsberg (DE)

(73) Assignee: Infineon Technologies AG (DE)

( * ) Notice: Subject to any disclaimer, the term of this patent is extended or adjusted under 35 U.S.C. 154(b) by 1757 days.

(21) Appl. No.: 10/911,319

(22) Filed: Aug. 4, 2004

(65) Prior Publication Data

US 2005/0030824 A1    Feb. 10, 2005

(30) Foreign Application Priority Data

Aug. 4, 2003   (DE) .................................. 103 35 643

(51) Int. Cl.
*G06F 12/00*   (2006.01)
*G06F 13/00*   (2006.01)
*G06F 13/28*   (2006.01)

(52) U.S. Cl. ........................................ 711/152; 711/163
(58) Field of Classification Search .................. 711/163, 711/152
See application file for complete search history.

(56) References Cited

U.S. PATENT DOCUMENTS

| | | | | |
|---|---|---|---|---|
| 3,742,458 A | * | 6/1973 | Inoue et al. .................... | 711/154 |
| 4,669,043 A | | 5/1987 | Kaplinsky .................... | 364/200 |
| 5,398,211 A | * | 3/1995 | Willenz et al. ........... | 365/230.05 |
| 5,848,435 A | * | 12/1998 | Brant et al. .................... | 711/152 |
| 6,021,476 A | * | 2/2000 | Segars .......................... | 711/163 |
| 6,317,872 B1 | * | 11/2001 | Gee et al. ...................... | 717/152 |
| 6,480,941 B1 | * | 11/2002 | Franke et al. ................. | 711/153 |
| 6,813,522 B1 | * | 11/2004 | Schwarm et al. ................ | 700/5 |
| 2001/0050385 A1 | * | 12/2001 | Kotecki et al. ............... | 257/296 |
| 2002/0021690 A1 | * | 2/2002 | Preiss et al. ................... | 370/352 |
| 2002/0178337 A1 | | 11/2002 | Wilson et al. ................ | 711/173 |
| 2003/0018860 A1 | * | 1/2003 | Krueger ....................... | 711/152 |
| 2003/0204693 A1 | * | 10/2003 | Moran et al. ................. | 711/163 |

OTHER PUBLICATIONS

AMBA Specification (Rev 2.0) (Copyright ARM Limited 1999), single p. "1-2".*
Flexible Peripherals Interconnect Bus Version 3.2 date unknown, pp. 12 -14 (included as Appendix C to U.S. Patent Publication 20020021690 on Apr. 9, 2001).*
The Authoritative Dictionary of IEEE standard terms, Seventh Edition, 2000, p. 398, definitions of "exception" and "exception condition".*

* cited by examiner

*Primary Examiner* — Kevin Ellis
*Assistant Examiner* — Prasith Thammavong
(74) *Attorney, Agent, or Firm* — Dickstein Shapiro LLP

(57) ABSTRACT

In an apparatus for controlling the access operation by a plurality of data processing devices to a memory, each data processing device (10, 11, 12) is assigned a respective address region which indicates the part of the addresses of the memory (13) which the respective data processing device can access. A control device (21) blocks an access operation by a data processing device to the memory (13) if the access operation address is not located in the address region which is assigned to the respective data processing device (10, 11, 12).

20 Claims, 1 Drawing Sheet

APPARATUS AND METHOD FOR CONTROLLING THE ACCESS OPERATION BY A PLURALITY OF DATA PROCESSING DEVICES TO A MEMORY

PRIORITY

This application claims priority to German application no. 103 35 643.6 filed Aug. 4, 2003.

TECHNICAL FIELD OF THE INVENTION

The present invention relates to an apparatus and a method for controlling the access operation by a plurality of data processing devices to a memory, and in particular to the protection of the integrity of data in a common memory when there are access operations by a plurality of data processing devices to this memory.

BACKGROUND OF THE INVENTION

In the field of mobile radio such as in, for example, wirefree baseband systems for intelligent telephones (smart phones) and personal digital assistants (PDA), designs with systems on one chip (SoC; SoC=System-on-Chip) are used. These designs are complex heterogeneous systems which are composed of a hardware platform such as, for example, processors, buses, memories and peripherals, and software modules such as, for example, device drivers, firm ware, operating systems and applications. The SoC designs have, in particular, a plurality of processor cores which access different memories integrated in the chip, or external memories.

Wirefree baseband systems are usually divided into a modem subsystem and an application subsystem. In the modem subsystem, software modules such as firm ware, protocol stacks, device drivers and real-time operating systems (RTOS; RTOS=Real Time Operating System) are implemented, these being made available particularly by device manufacturers (OEM; OEM=Original Equipment Manufacturer) and chip manufacturers. In contrast, in the application subsystem, in addition to device drivers and operating systems (OS), software modules such as audio, video, game, e-mail, Internet, office and e-commerce applications are implemented, said applications being made available by end users and service providers. The software modules upgrade the wirefree baseband systems by enlarging, for example, their range of application.

The requirements made of the hardware platform increase as a result of the number and complexity of the software modules which are implemented in the different processor cores and processors and are made available by numerous different manufacturers. Owing to the different priorities and security requirements of the software modules it is therefore particularly important to keep the baseband system stable and to protect, in particular, the software of the equipment manufacturer (OEM) against mutilation and modifications by software applications of the end user.

If a plurality of processors access one memory there is therefore a problem in maintaining data integrity and data security of each software application which is assigned to a processor.

FIG. 2 shows a known design of a system on a chip (SoC) which solves this problem. The system 1 has two processors 2 and 3 which are connected via interfaces 4 and 5 to separate external memories 6 and 7. Each processor 2, 3 operates on its own memory 6, 7. A further, system-internal memory 8 is arranged between the processors 2 and 3. Data integrity and data security are ensured by virtue of the fact that the processors 2 and 3 have different execution environments as a result of the use of the external memories 6 and 7. The communication between the processors 2 and 3 is ensured via the system-internal memory 8.

A disadvantage of this design is that a plurality of interfaces with external memories having an assigned logic and assigned connection areas are necessary, which increases the complexity of the design.

A further disadvantage is that an additional system-internal memory is necessary in order to permit communication between the processors, which also increases the complexity of the design.

SUMMARY OF THE INVENTION

The object of the present invention is to provide a simple apparatus and a simple method for controlling the access operation by a plurality of data processing devices to a memory.

The idea on which the present invention is based is to use a programmable logic hardware module, which is arranged between different processors and a memory controller or a memory, to control memory access operations of the processors to the memory during run time, in such a way that data security and data integrity are ensured. In this process, the hardware module is preferably configured during an initialization phase of the system, and only by one or more specific privileged processors.

The invention provides an apparatus for controlling the access operation by a plurality of data processing devices to a memory, having memory devices for storing address regions, each data processing device being assigned one or more address regions which indicates or indicate the part of the addresses of the memory which the respective data processing device can access; and control devices for comparing the addresses of access operations of the data processing devices to the memory with the stored address regions, and for blocking an access operation of a data processing device to the memory if the address of an access operation of a respective data processing device is not located in the address region or regions which is or are assigned to the respective data processing device, the apparatus being arranged between the data processing devices and the memory.

The invention also provides a method for controlling the access operation by a plurality of data processing devices to a memory, having the steps of storing address regions, each data processing device being assigned one or more address regions which specifies or specify the part of the addresses of the memory which the respective data processing device can access; and of comparing the addresses of access operations by the data processing devices to the memory with the stored address regions, and blocking an access operation by a data processing device to the memory if the address of an access operation of a respective data processing device is not located in the address region or address regions.

According to one preferred development of the apparatus, a specific data processing device of the data processing devices is connected to the memory devices in order to store the address regions in the memory devices.

According to a further preferred development, the address regions are stored in the memory devices during the initialization of the apparatus.

According to a further preferred development, the apparatus also has a signalling device for sensing and signalling a blocked access operation, the signalling device being connected to the control devices in order to sense the blocked access operation, and being connected to the specific data processing device in order to signal the blocked access operation to the specific data processing device.

According to a further preferred development, the signaling device has a memory device for storing information relating to blocked access operations.

According to a further preferred development, information relating to a blocked access operation has the blocked address, the blocked data and connection information.

According to a further preferred development, the data processing devices have processors, digital signal processors (DSP), microcontrollers and/or DMA controllers (DMA=Direct Memory Access).

According to a further preferred development, the data processing devices are connected to the apparatus via buses.

According to a further preferred development, the buses have AMBA buses (AMBA=Advanced Microprocessor Bus Architecture), AHB buses (AHB=Advanced Highspeed Bus) and/or FPI buses (FPI=Flexible Peripheral Interconnect).

According to a further preferred development, the memory has a direct access memory (RAM; RAM=Random Access Memory) or a dynamic direct access memory (DRAM; DRAM=Dynamic Random Access Memory).

According to a further preferred development, the memory devices have registers, in each case one register being assigned to one data processing device.

One advantage of the present invention is that it improves the system stability, the data integrity and the software security in applications in which, for example, a plurality of processors access one memory.

A further advantage of the present invention is that it increases the system reliability since the device for controlling the access operation according to the invention is initialized once and access operations to a memory are checked automatically by the device.

A further advantage of the present invention is that in comparison to possible software implementations a hardware implementation causes a smaller degree of reduction of the system power.

BRIEF DESCRIPTION OF THE DRAWINGS

Preferred exemplary embodiments of the present invention are explained in more detail below with reference to the appended drawings, in which.

PREFERRED EMBODIMENTS OF THE INVENTION

Figure 1:
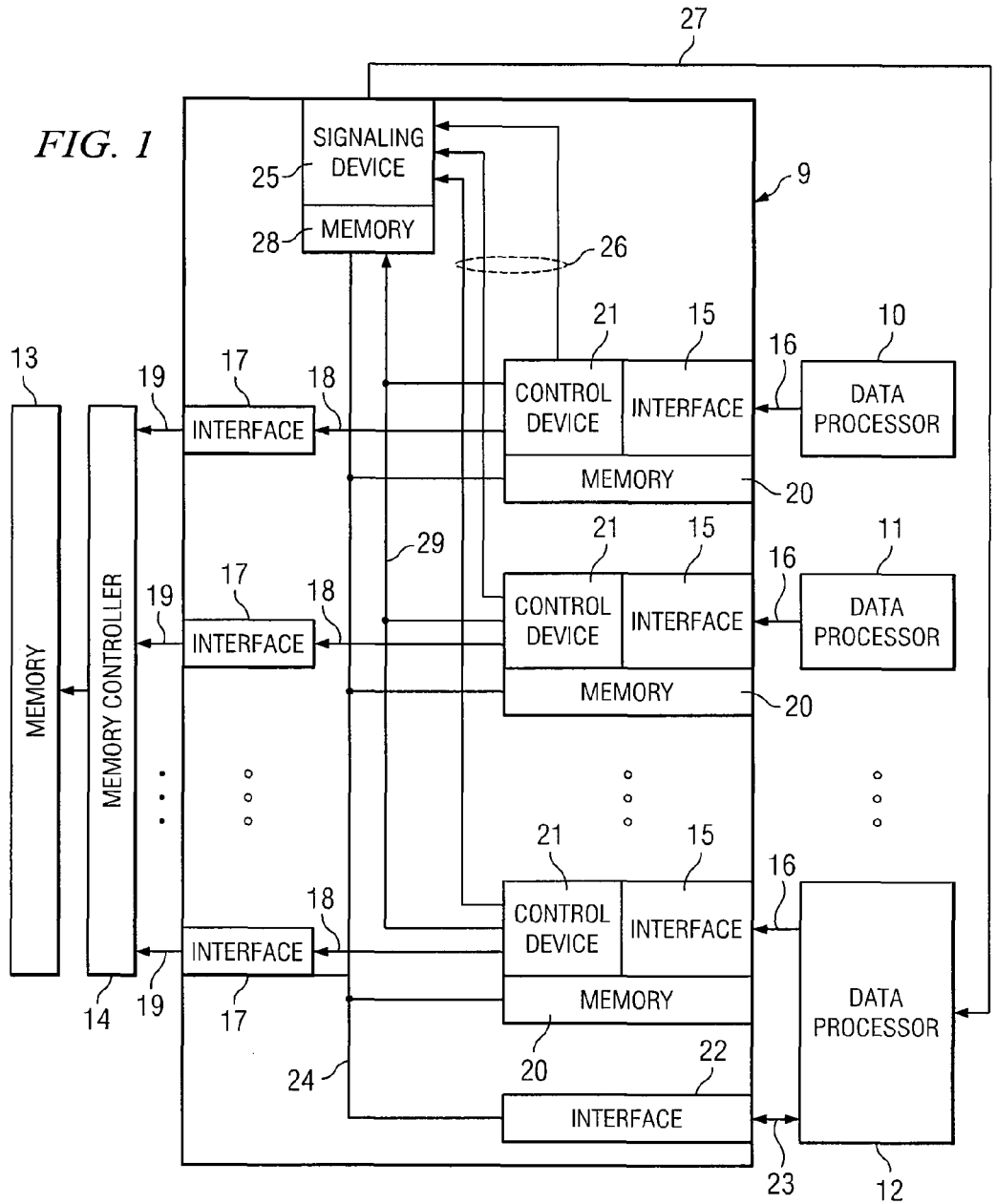
FIG. 1 shows an exemplary embodiment of an apparatus according to the present invention.
Figure 2:
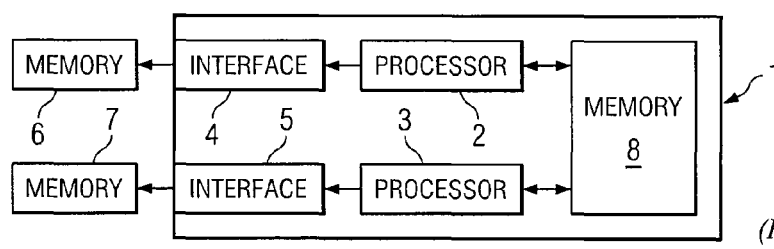
FIG. 2 shows a known design of a system on a chip (SoC).

FIG. 1 shows an exemplary embodiment of a device for controlling the access operation by a plurality of data processing devices to a memory according to the present invention. The apparatus 9 is arranged between a plurality of data processing devices 10, 11 and 12 and the common memory 13, which is preferably connected to the apparatus 9 via a memory controller 14, and the plurality of data processing devices 10, 11 and 12 are connected to the memory 13 via the apparatus 9. The data processing devices (Master) 10, 11 and 12 are preferably processors, digital signal processors (DSP), microcontrollers and/or DMA controllers (DMA=Direct Memory Access). The memory 13 is preferably a direct access memory (RAM; RAM=Random Access Memory) or a dynamic direct access memory (DRAM; DRAM=Dynamic Random Access Memory).

The apparatus 9 has a first set of interfaces 15, each interface 15 being connected to a data processing device 10, 11 and 12 via a respective bus 16. The interfaces 15 are referred to here as bus-slave connection interfaces, the data processing devices 10, 11 and 12 acting as masters on the respective bus 16. The buses 16 are preferably AMBA buses (AMBA=Advanced Microprocessor Bus Architecture), AHB buses (AHB=Advanced Highspeed Bus) and/or FPI buses (FPI=Flexible Peripheral Interconnect).

The apparatus 9 also has a second set of interfaces 17 which is assigned to the first set of interfaces 15. Each interface 17 of the second set of interfaces 17 is connected to an assigned interface 15 of the first set of interfaces 15 via a respective line 18. Each interface 17 of the second set of interfaces 17 is also connected via a respective bus 19 to a respective connection of the memory controller 14. The memory controller 14 arbitrates access to the buses 19 and translates bus information. The interfaces 17 of the second set of interfaces 17 are referred to here as bus-master connection interfaces The apparatus 9 is also referred to as a multi-port memory protection unit (multi-port MPU) owing to the plurality of connections.

The apparatus 9 also has memory devices 20 which are assigned to the interfaces 15 of the first set of interfaces 15. The memory devices 20 are used to store address regions or address windows, each data processing device 10, 11 and 12 being assigned a respective address region which indicates the part of the addresses of the memory 13 which the respective data processing device 10, 11 and 12 can access. The address regions are used to define a region of addresses of the memory 13 for which a respective data processing device 10, 11 and 12 has access rights. The address regions are preferably defined and selected by means of a base address and the indication of the size of the address region, in such a way that system stability, data integrity and software security are maintained. The address regions are also preferably selected in such a way that they do not overlap.

In the exemplary embodiment shown in FIG. 1, the memory devices 20 preferably have registers which are assigned to a respective interface 15 of the first set of interfaces 15 or are connected thereto. Each register is assigned here to a data processing device 10, 11 and 12 and is used to store the assigned address region. The registers preferably each have a subregister for storing a basic address, and a subregister for storing a size of the respective address region. The registers or subregisters have, for example, a size of 8, 16 and 32 bits. The memory devices 20 can alternatively have any type of memory device even, for example, a direct access memory (RAM; RAM=Random Access Memory) which is arranged and assigned locally to any interface 15 of the first set of interfaces 15, or in centralized fashion as a common memory device of the interfaces 15 of the first set of interfaces 15.

The apparatus 9 also has control devices 21 which are assigned to the interfaces 15 of the first set of interfaces 15. The control devices 21 are used to compare addresses of access operations of the data processing devices 10, 11 and 12 to the memory 13 with the address regions stored in the memory devices 20, and to block the access operation by a data processing device 10, 11 and 12 to the memory if the address of an access operation of a respective data processing device 10, 11 and 12 is not located in the address region which is assigned to the respective data processing device 10, 11 and 12, or the respective data processing device 10, 11 and 12 does not have any access rights for the addressed address region.

In the exemplary embodiment shown in FIG. 1, the control devices 21 preferably have individual control devices 21 which are assigned to a respective interface 15 of the first set of interfaces 15, and to a respective memory device 20, or are connected thereto. Each control device 21 is assigned here to a data processing device 10, 11 and 12. The control devices 21 can alternatively have any type of control device which is arranged locally assigned to any interface 15 of the first set of interfaces 15 and each memory device 20 or centrally as a common control device of the interfaces 15 of the first set of interfaces 15 and of the memory devices 20.

At least one specific data processing device 12 of the data processing devices 10, 11 and 12 is connected to the memory devices 20 in order to store the address regions in the memory devices 20. For this purpose, the apparatus 9 in FIG. 1 preferably has a further interface 22 which is connected by a further bus 23 to the at least one specific data processing device 12 and by a line 24 to the memory devices 20.

The specific data processing device 12 acts as a master on the further bus 23. The specific data processing device 12 is referred to here, for example, as a data processing device with the highest priority and with control functions, and the further interface 22 is referred to here as a register interface, and the further bus 23 as a register bus.

The apparatus 9 also has a signaling device 25 for sensing and signaling blocked access operations, the signaling device 25 being connected to the control device 21 via lines 26 in order to sense blocked access operations, and being connected to the specific data processing device 12 via a line 27 in order to signal blocked access operations to the specific data processing device 12. The signaling device 25 has a memory device 28 for storing information relating to blocked access operations, said memory device 28 being connected to the line 24. The specific data processing device 12 can read out the memory device 28 via the line 24. The memory device 28 is also connected to the control devices 21 via lines 29 in order to receive information relating to blocked access operations from the control devices 21. The memory device 28 is preferably a register but can have any other desired form of a memory. The information relating to a blocked access operation has, for example, the blocked address or the address which has caused an access rejection, the blocked data during the access rejection and connection information relating to the connection or the interface at which the blocked access occurred. An assigned subregister is preferably provided for each of these information items. The memory devices 20 and 28 can be written to or read out only via the interface 22, therefore only by means of the specific data processing device 12 or by means of a limited number of specific data processing devices.

When the apparatus 9 is operating, the memory devices 20 are configured by means of the interface 22 by virtue of the fact that the specific data processing device 12 writes into the memory devices 20 in order to define and store the address regions. The specific data processing device 12 therefore has access rights to each interface 15 of the apparatus 9. The configuration of the memory devices 20 is preferably carried out during the initialization of the apparatus 9.

If access operations by the data processing devices 10, 11 and 12 via the buses 16 occur during the operation, the address of an access operation is sensed by the control devices 21 and compared with the respective address region stored in a memory device 20. If the address is located in the address region, the access operation of the respective data processing device 10, 11 and 12 to the memory 13 is carried out via a respective line 18, a respective interface 17, a respective bus 19 and the memory controller 14. If the address is not located in the address region, the access operation by the respective data processing device 10, 11 and 12 is blocked by the control devices 21. The memory device 28 receives information relating to the respectively blocked access operation from the control devices 21 via the lines 29, and stores said information. The blocking of an access operation is then signalled to the signalling device 25 by the control devices 21 via the lines 26, and the blocked access operation is sensed by the signalling device 25 and the latter generates a signal (Exception) which is transmitted to the specific data processing device 12 via the line 27. The signal on the line 27 indicates the access rejection to the specific data processing device 12 and is preferably an interrupt. The interrupt can be signalled by devices such as Service Request Control Nodes (SRN) with a Service Request Control (SRC) register or by register sets (Control, Status, Mask, Set, Clear). If the specific data processing device 12 senses the signal on the line 27, the latter reads the memory device 28 via the interface 22 and the line 24 in order to obtain information such as, the blocked address, the blocked data during the access rejection and information relating to the connection at which the blocked access operation occurred. The specific data processing device 12 handles the access rejection as a function of the received information and transmits, for example, data relating to the access rejection to a suitable position for further processing.

The apparatus 9 can be used as a programmable dedicated hardware module in all embedded systems (SoC), and for example in a baseband (modem subsystem) and application (application subsystem) processor chip of a mobile radio terminal for GSM (=Global System for Mobile communications) or EDGE (=Enhanced Data rates for GSM Evolution) which is connected via a DRAM controller to a dynamic direct access memory (DRAM; DRAM=Dynamic Random Access Memory). The common memory 13 can be implemented here as SoC-external memory. Such a baseband and application processor chip has, for example, ARM926EJ microcontrollers from ARM Inc., USA, DMA controllers and digital signal processors of the StarCore SC120 type from StarCore LLC, Austin, Tex., USA.

Although the present invention is described above with reference to a preferred exemplary embodiment, it is not restricted thereto but rather can be modified in a variety of ways.

We claim:

1. An apparatus for controlling the access operation by a plurality of data processing devices to a memory, comprising:
   a plurality of memory devices for storing address regions, each memory device being assigned to only one data processing device and including at least one respective address region which indicates the part of the addresses of the memory which the assigned data processing device can access; and
   for each memory device a control device for comparing the addresses of access operations of the respective assigned data processing device to the memory with the stored address regions, and for blocking an access operation of the respective assigned data processing device to the memory if the address of an access operation of the respective assigned data processing device is not located in an address region which is assigned to the respective data processing device, the apparatus being arranged between the data processing devices and the memory.

2. The apparatus according to claim 1, wherein a specific data processing device of the data processing devices is connected to the memory devices in order to store the address regions in the memory devices.

3. The apparatus according to claim 1, wherein the address regions are stored in the memory devices during the initialization of the apparatus.

4. The apparatus according to claim 2, wherein the apparatus also has a signaling device for sensing and signaling a blocked access operation, the signaling device being connected to the control devices in order to sense the blocked access operation, and is connected to the specific data processing device in order to signal the blocked access operation to the specific data processing device.

5. The apparatus according to claim 4, wherein the signaling device has a memory device for storing information relating to blocked access operations.

6. The apparatus according to claim 5, wherein information relating to a blocked access operation has the blocked address, the blocked data and connection information.

7. The apparatus according to claim 1, wherein the data processing devices have processors selected from the group consisting of: digital signal processors, microcontrollers and direct memory access controllers.

8. The apparatus according to claim 1, wherein the data processing devices are connected to the apparatus via buses.

9. The apparatus according to claim 8, wherein the buses have Advanced Microprocessor Bus Architecture buses selected from the group consisting of: Advanced Highspeed Bus buses and Flexible Peripheral Interconnect buses.

10. The apparatus according to claim 1, wherein the memory has a random access memory or a dynamic random access memory.

11. The apparatus according to claim 1, wherein the memory devices have registers, in each case one register being assigned to one data processing device.

12. A method for controlling the access operation by a plurality of data processing devices to a memory, comprising the steps of:
 for each data processing device storing at least one address region in a memory device which is assigned only to that data processing device, wherein the at least one address region indicates the part of the addresses of the memory which the data processing device can access; and
 comparing the addresses of access operations of the data processing devices to the memory with the stored address regions in each memory device, and blocking an access operation of a data processing device to the memory if the address of an access operation of a respective data processing device is not located in an address region.

13. A system for controlling the access operation to a memory, comprising:
 a plurality of data processing devices;
 a memory access control unit coupled between said data processing devices and said memory comprising a plurality of registers for storing address regions, each register being assigned to only one data processing device and comprising at least one respective address region which indicates the part of the addresses of the memory which the assigned data processing device can access; and
 for each register a control device for comparing the addresses of access operations of the respective assigned data processing device to the memory with the stored address regions, and for blocking an access operation of the respective assigned data processing device to the memory if the address of an access operation of the respective assigned data processing device is not located in an address region which is assigned to the respective data processing device.

14. The system according to claim 13, wherein a specific data processing device of the data processing devices is connected to the registers in order to store the address regions in the memory devices.

15. The system according to claim 13, wherein the address regions are stored in the registers during the initialization of the memory access control unit.

16. The system according to claim 14, wherein the memory access control unit also has a signaling device for sensing and signaling a blocked access operation, the signaling device being connected to the control devices in order to sense the blocked access operation, and is connected to the specific data processing device in order to signal the blocked access operation to the specific data processing device.

17. The system according to claim 16, wherein the signaling device has a memory device for storing information relating to blocked access operations.

18. The system according to claim 17, wherein information relating to a blocked access operation has the blocked address, the blocked data and connection information.

19. The system according to claim 13, wherein the data processing devices have processors selected from the group consisting of: digital signal processors, microcontrollers and/or direct memory access controllers.

20. The system according to claim 13, wherein the data processing devices are connected to the memory access control unit via buses.

* * * * *